(12) United States Patent
Jiang

(10) Patent No.: US 10,833,665 B2
(45) Date of Patent: Nov. 10, 2020

(54) PHASE ERROR CORRECTION FOR CLOCK SIGNALS

(71) Applicant: TEXAS INSTRUMENTS INCORPORATED, Dallas, TX (US)

(72) Inventor: Jianfeng Jiang, Fremont, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/551,263

(22) Filed: Aug. 26, 2019

(65) Prior Publication Data

US 2020/0186137 A1 Jun. 11, 2020

Related U.S. Application Data

(60) Provisional application No. 62/777,807, filed on Dec. 11, 2018.

(51) Int. Cl.
*H02M 3/158* (2006.01)
*H03K 5/15* (2006.01)
*H03K 5/22* (2006.01)
*H03K 5/151* (2006.01)

(52) U.S. Cl.
CPC ............ *H03K 5/22* (2013.01); *H02M 3/1582* (2013.01); *H03K 5/1515* (2013.01); *H03K 5/15066* (2013.01)

(58) Field of Classification Search
CPC .... H03K 5/22; H03K 3/15066; H03K 5/1515; H02M 3/1582
See application file for complete search history.

(56) References Cited

U.S. PATENT DOCUMENTS

| | | | |
|---|---|---|---|
| 6,847,008 B2 | 1/2005 | Myers | |
| 7,075,346 B1 | 7/2006 | Hariman | |
| 8,446,137 B2* | 5/2013 | Mariani | ................ H02M 3/156 323/222 |
| 8,564,259 B2 | 10/2013 | Chen | |
| 10,367,484 B2* | 7/2019 | Zhao | ................... H02M 3/1584 |
| 2011/0148372 A1* | 6/2011 | Mariani | ................ H02M 3/156 323/272 |
| 2018/0034450 A1 | 2/2018 | Zhao | |

* cited by examiner

*Primary Examiner* — Dinh T Le
(74) *Attorney, Agent, or Firm* — Mark Allen Valetti; Charles A. Brill; Frank D. Cimino

(57) ABSTRACT

A multi-phase clock generator circuit includes a phase reference generator circuit configured to generate a phase reference signal in response to a phase selection signal and a peak ramp signal. A phase error correction circuit is configured to provide an error signal based on a synchronization clock signal and a multi-phase clock signal. The error signal is applied to the phase reference signal to correct for phase errors in the multi-phase clock signal. A comparator is configured to compare a ramp signal and the phase reference signal to produce the multi-phase clock signal.

24 Claims, 7 Drawing Sheets

US 10,833,665 B2

PHASE ERROR CORRECTION FOR CLOCK SIGNALS

CROSS-REFERENCE TO RELATED APPLICATION

This application claims the benefit of priority from U.S. provisional patent application No. 62/777,807, filed Dec. 11, 2018, and entitled PHASE ERROR CORRECTION LOOP WITH CONSTANT LOOP GAIN FOR MULTIPHASE CLOCKS, which is incorporated herein by reference in its entirety.

TECHNICAL FIELD

This disclosure relates to phase error correction for generating multi-phase clock signals.

BACKGROUND

Multi-phase stackable power supply circuits are used to generate relatively high currents for various applications. Each stackable power supply circuit may be an AC-to-DC or DC-to-DC converter, such as a buck converter or buck boost converter. Each stackable power supply circuit is typically connected to a common input bus and a common output bus. They are normally configured as a Master and one or more Slave circuits, each having a respective phase and operating in synchronization with a synchronization clock signal. Several methods may be used to generate multi-phase clock signals. Many approaches for generating multi-phase clock signals tend to introduce errors or become unstable as the number of phases increase.

SUMMARY

In one example, a multi-phase clock generator circuit includes a phase reference generator circuit configured to generate a phase reference signal in response to a phase selection signal and a peak ramp signal. A phase error correction circuit is configured to provide an error signal based on a synchronization clock signal and a multi-phase clock signal. The error signal is applied to the phase reference signal to correct for phase errors in the multi-phase clock signal and produce a corrected phase reference signal. A comparator is configured to compare a ramp signal and the corrected phase reference signal to produce the multi-phase clock signal.

In another example, a multi-phase clock generator circuit includes a ramp generator that includes an output. A comparator has first and second inputs and a clock output. The first input of the comparator is coupled to the output of the ramp generator. A peak detector circuit has an input coupled to the output of the ramp generator. A buffer has an input coupled to an output of the peak detector circuit. A phase reference generator circuit has an input coupled to an output of the buffer and has an output coupled to the second input of the comparator. A phase error correction circuit has an input coupled to the clock output and an output coupled to the second input of the comparator.

In yet another example, a system includes a ramp generator configured to provide ramp signal based on a synchronization clock signal. A peak detector is configured to detect a peak in the ramp signal during each period of a multi-phase clock signal and provide a peak ramp signal. A phase reference generator is configured to generate a phase reference signal based on the peak ramp signal and a phase angle selection signal. A phase error correction circuit is configured to provide an error current signal based on the synchronization clock signal and the multi-phase clock signal, the error current signal being applied to the phase reference generator to correct the phase reference signal and provide a corrected phase reference signal. A comparator is configured to provide the multi-phase clock signal based on the ramp signal and the corrected phase reference signal. A power supply is configured to supply power at an output thereof based on the multi-phase clock signal.

DETAILED DESCRIPTION

This disclosure relates to an error correction scheme for use in generating a multi-phase clock signal. For example, systems and circuits disclosed herein exhibit improved performance over a range of frequencies and for different numbers of clock phases than many existing approaches.

Figure 1:
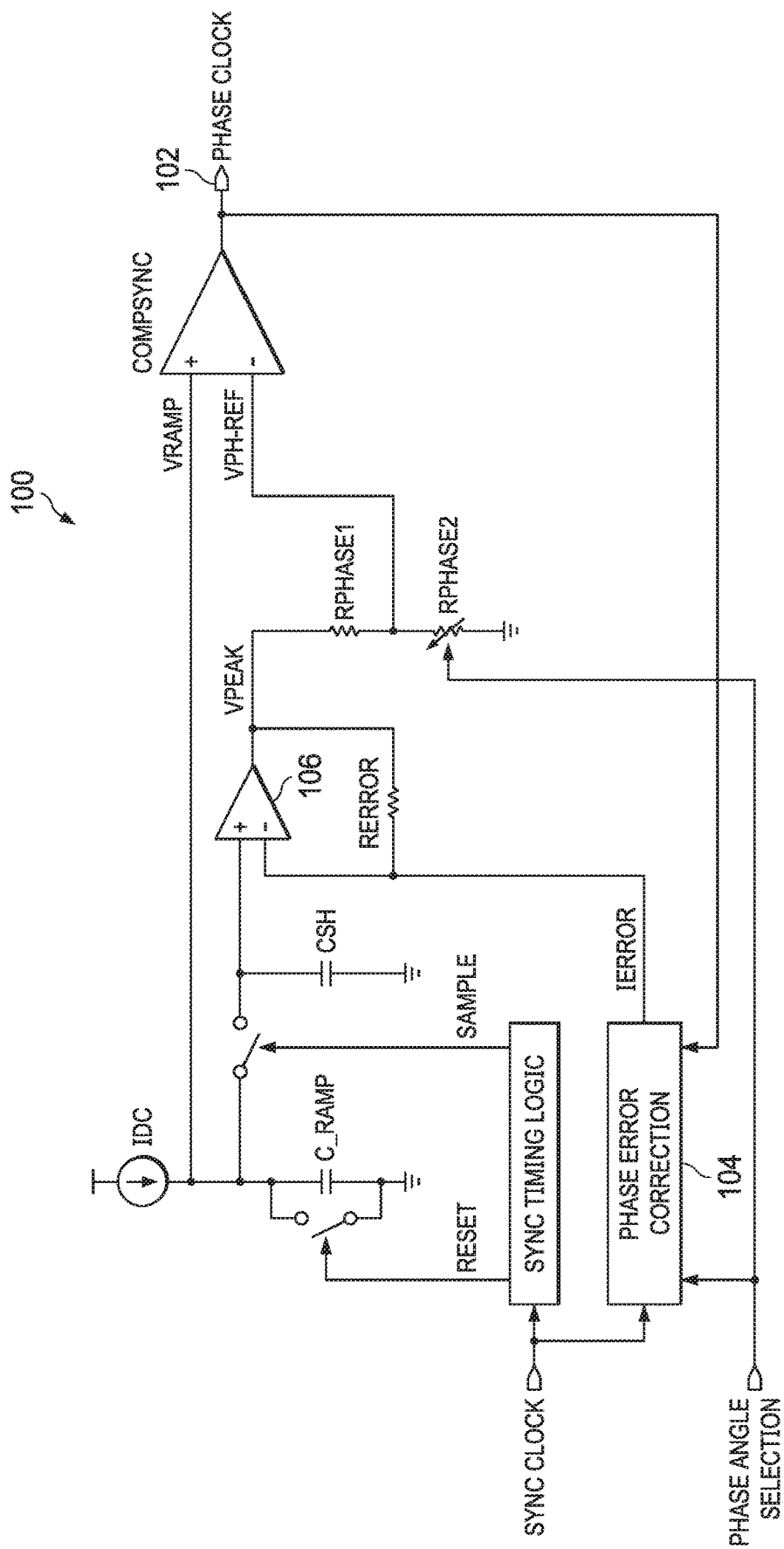
FIG. 1 illustrates an example of a clock synchronization circuit.

As an example, FIG. 1 illustrates a circuit 100 designed to generate a multi-phase clock signal at 102. The circuit 100 includes a phase error correction loop 104, which generates an error current Ierror proportional to the phase error. The error current Ierror is fed into a buffer 106. The phase error correction loop 104 includes logic that is configured to control a charge current and discharge current that is applied to produce the error current Ierror to be proportional to phase error based on a synchronization clock (SYNC CLOCK) and a phase clock signal. The error current Ierror and a sampled peak of the ramp signal (VRAMP) are fed as inputs to the buffer 106 which in turn provides a ramp-peak reference voltage VPEAK that is adjusted based on the error current Ierror. The reference voltage VPEAK is divided down based on a ratio of resistors RPHASE1 and RPHASE2, which provides a variable resistance set based on a phase angle selection signal. The resistors Rphase1 and Rphase2 then provides a divided-down phase reference signal VPH_REF that is compared with the ramp signal VRAMP to generate the phase clock at 102. The error current Ierror that is provided to the buffer 106 will thus translate to the changes in the phase reference voltage VPH_REF and thereby modulate the phase clock for the selected phase. However, the circuit 100 might not perform well over a large range of frequencies (e.g., 400 KHz to 2.5 MHz). For example, because the phase error correction loop is in the feedback path of the buffer 106, unless the buffer 106 is designed with very high bandwidth (e.g., at substantial cost), the buffer responds too slowly to changes at such high switching frequencies. Additionally, as the number of phases increases, the range of correction becomes too small. For the example of four clock phases (e.g., 0, 90, 180 and 270), the error correction range for phase 90 is only ¼ of the total range at the top, which requires additional complexity to provide sufficient range of correction range. This error correction range issue is further increased for low values of Vcc (e.g., when Vcc is less than 3V). Additionally, when the error signal is large, the phase clock produced by the circuit 100 may also exhibit large jitter for each clock cycle.

The systems and circuits disclosed herein provide a multi-phase clock generator that solves the various problems described above. This is achieved by a phase error correction loop that is configured to provide the phase error signal directly to a phase divider—bypassing the buffer circuit. This enables the phase error correction loop to have substantially constant gain over frequency and for large number of phases. Advantageously, the phase error correction loop is designed to correct for phase errors for all frequencies and phases in a single clock cycle. In one example embodiment, a phase error correction loop can achieve a constant loop gain across a wide range of frequencies (e.g., 400 KHz to 2.5 MHz). Additionally, by implementing the phase error correction loop, as disclosed herein, a lower bandwidth and lower cost buffer can be utilized to provide the peak sync output signal to corresponding phase sync reference generator.

Figure 2:
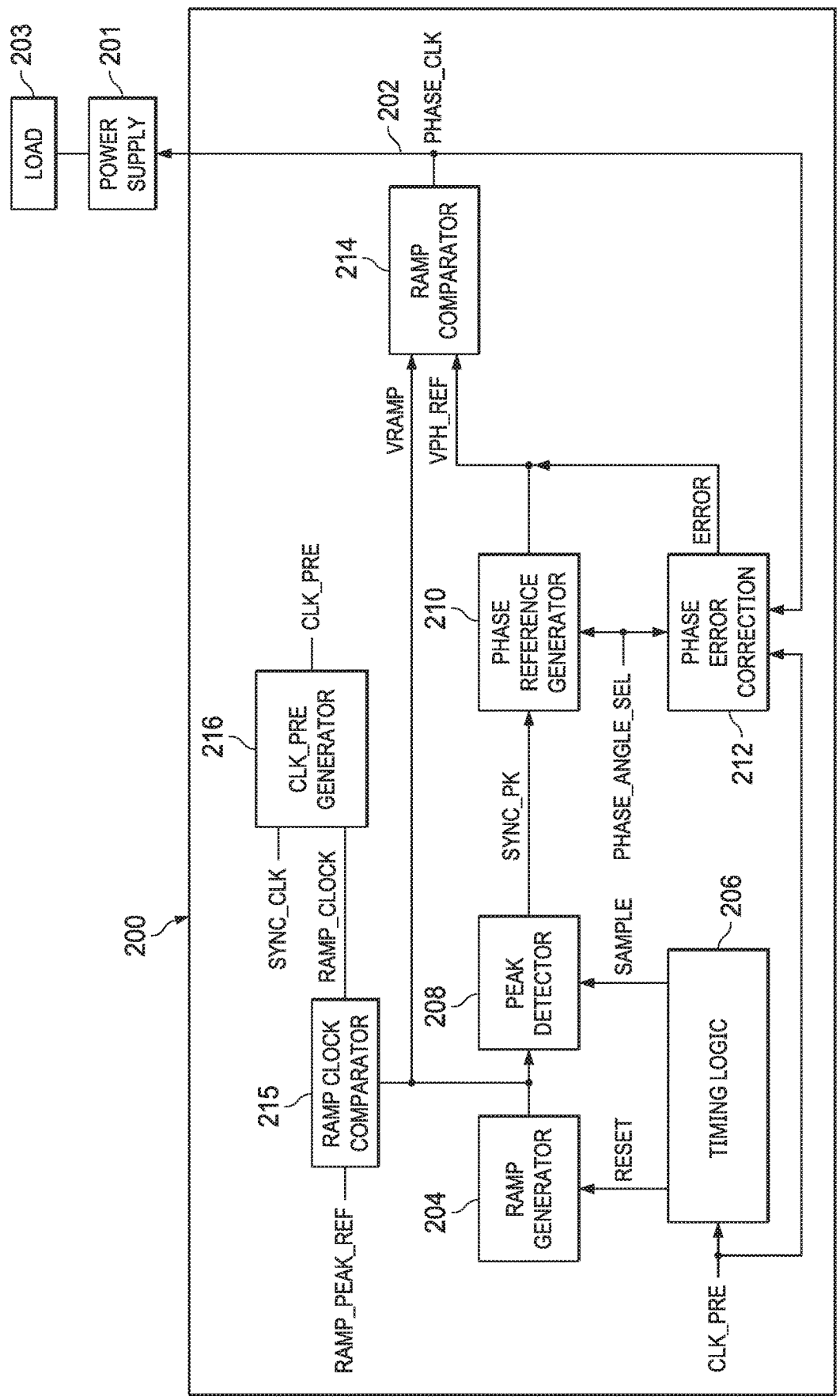
FIG. 2 illustrates an example block diagram of a clock synchronization system.

FIG. 2 is a block diagram depicting an example embodiment of system that includes a multi-phase clock generator 200. As an example, the system may include a power supply circuit 201, such as stackable power supply circuit configured as an AC-to-DC or DC-to-DC converter (e.g., a buck converter or buck-boost converter) to supply electrical power (e.g., regulated DC voltage or current) at an output thereof that is connected to a load 203. The system thus may correspond to various types of electronic systems, such as such as computers, servers, communications systems, smart power systems, LED lighting systems, automobiles, as well as various other applications that may utilize the power supply circuit 201 that is driven by the multi-phase clock provided by the clock generator 200.

The phase clock generator 200 includes circuitry configured to provide a multi-phase clock signal (PHASE_CLK) at an output 202 based on a clock preset signal (CLK_PRE) and a phase angle selection signal (PHASE_ANGLE_SEL). For example, the CLK_PRE signal defines a synchronization signal, such as a phase zero clock that is used to synchronize the clock generator 200 at each clock period of the multi-phase clock signal PHASE_CLK. The CLK_PRE signal may be provided to a timing logic 206 as well as to phase error correction circuit 212 for synchronizing operation of the various signals within the clock generator 200, as disclosed herein. For example, the timing logic 206 is configured to generate the SAMPLE signal (e.g., as a short pulse) in response to the CLK_PRE pulse, and the RESET signal can be a short pulse generated from the SAMPLE signal.

As used herein, the term "circuit" can include a collection of active and/or passive elements that perform a circuit function, such as an analog circuit and/or digital circuit. Additionally or alternatively, for example, the term "circuit" can include an integrated circuit (IC) where all or some of the circuit elements are fabricated on a common substrate (e.g., semiconductor substrate, such as a die or chip) or within a common package herein. For example, the clock generator 200 may be implemented in and IC chip, which may also contain the power supply 201 and other circuitry.

The timing logic 206 is configured to provide a corresponding reset signal (RESET) to the ramp generator 204 in response to the CLK_PRE signal. The ramp generator 204 can be initialized and generate a corresponding ramp signal, such as a voltage ramp signal (VRAMP) based on the RESET signal. The ramp signal VRAMP can be provided to inputs of a peak detector 208, a ramp comparator 214 and a ramp clock comparator 215. The peak detector 208 is configured to detect a peak in the ramp signal VRAMP. For example, the peak detector 208 is configured to provide a sync peak output signal (SYNC_PK) in response to a sample timing signal (SAMPLE) that is provided by the timing logic 206. As an example, the peak detector 208 can include sample and hold circuitry, which is triggered in response to the SAMPLE signal, and a corresponding output buffer. The output buffer of the peak detector 208 in turn provides the corresponding SYNC_PK signal to a phase reference generator 210.

In some examples, the ramp clock comparator 215 is configured to compare the VRAMP signal to a reference voltage RAMP_PEAK_REF and generate a ramp clock signal RAMP_CLOCK. In an example, the RAMP_CLOCK internally generated by the ramp clock comparator 215 implemented within the phase clock generator 200. A CLK_PRE generator 216 (e.g., logic gates) is configured to generate the CLK_PRE signal based an external SYNC_CLK or it may be generated based on the internally generated RAMP_CLOCK.

For example, the phase reference generator 210 is configured to provide a phase reference in response to the SYNC_PK signal and a phase angle selection (PHASE_ANGLE_SEL) signal. As an example, the phase reference generator 210 can be implemented as a variable voltage divider circuit (e.g., a resistive divider, an inductive divider, a capacitive divider, a resistor-capacitor divider or the like) that is configured to produce an output voltage corresponding to the phase reference voltage (VPH_REF) signal in response to the PHASE_ANGLE_SEL signal.

The clock generator 200 also includes the phase error correction circuit 212 that forms part of a phase error correction loop. The phase error correction circuit 212 is configured to generate an ERROR signal based on the PHASE_CLK signal, the PHASE_ANGLE_SEL signal and the CLK_PRE signal. The phase error correction circuit 212 applies the ERROR signal directly to the phase reference generator 210 to correct the VPH_REF signal that is provided to an input of the ramp comparator 214. For example, the phase error correction circuit 212 is configured to provide the ERROR signal as a current signal that is applied to increase or decrease the voltage of the divider circuit in the phase reference generator based on the phase indicated by the PHASE_ANGLE_SEL signal and the PHASE_CLK signal that is being fed back. The ERROR signal thus is applied to input node of the ramp comparator 214 where the phase reference generator 210 provides phase error signal VPH_REF signal such that the VPH_REF signal produced by the phase reference generator 210 is adjusted accordingly.

The ramp comparator 214 receives at inputs both the ramp signal VRAMP from the ramp generator 204 and the VPH_REF signal (e.g., as adjusted by the ERROR signal). The ramp comparator 214 is configured to compare the adjusted VPH_REF signal with the ramp signal to generate the corresponding PHASE_CLK signal at 202. The phase error correction circuit 212 in the feedback loop for the clock generator 200 thus is configured to correct phase errors in the PHASE_CLK signal that is provided at 202. Advantageously, the phase error correction loop may operate with constant loop gain over the range of expected frequencies and for all phases of the multi-phase clock signal that is being generated. Additionally, the phase error correction circuit 212 can correct many phase errors in one clock cycle because the error signal is provided directly to the phase reference generator 210.

Figure 3:
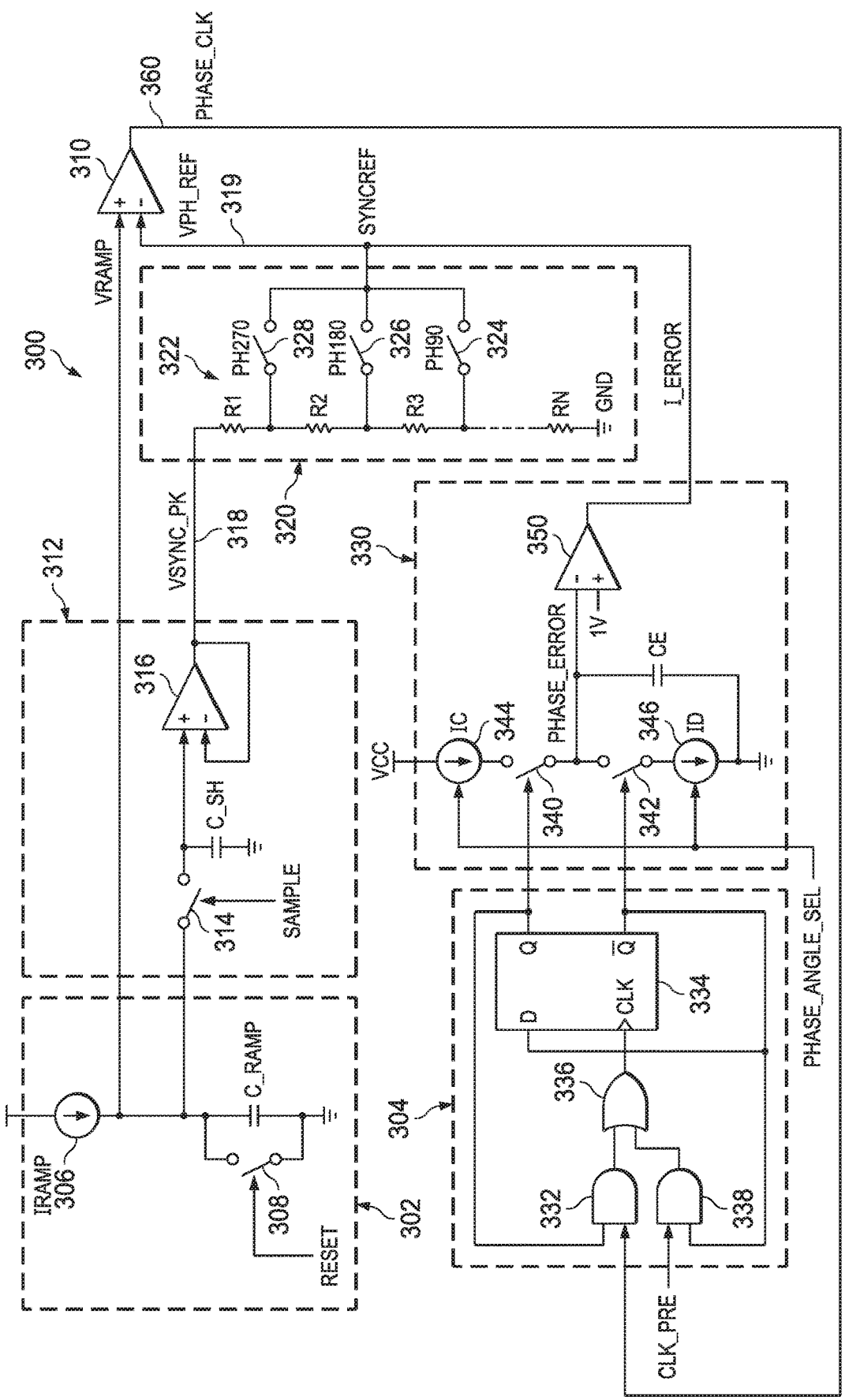
FIG. 3 illustrates an example of circuit diagram of the clock synchronization system of FIG. 2.

FIG. 3 depicts an example of a multi-phase clock generator circuit 300. The circuit 300 is configured to generate a multi-phase clock signal (PHASE_CLK) at an output 360. The circuit 300 includes a ramp generator 302 (e.g., corresponding to ramp generator 204) that is configured to generate a voltage ramp signal VRAMP. In this example, the ramp generator 302 includes a current source 306 configured to provide a DC current, indicated at IRAMP, to a capacitor C_RAMP that is connected between the current source and electrical ground. A switch device 308 is connected in parallel with the capacitor C_RAMP. The switch device 308 is controlled in response to the RESET signal provided by timing logic (e.g., timing logic 206 of FIG. 2). For example, the RESET signal is provided to activate the switch device 308 and discharge the capacitor C_RAMP. After the RESET signal ends, the switch device 308 is opened, and the DC current source 306 charges the ramp capacitor creating the ramp signal VRAMP. An output of the ramp circuit 302 is coupled to provide the ramp signal VRAMP to a non-inverting input of a comparator 310 (e.g., corresponding to ramp comparator 214). The output of the ramp generator 302 is also coupled to an input of a peak detector circuit 312 (e.g., corresponding to peak detector 208).

The peak detector circuit 312 is configured to provide a sync peak output signal (SYNC_PK) in response to detecting a peak in the ramp signal VRAMP based on a SAMPLE signal (provided by timing logic 206 of FIG. 2). The peak detector circuit 312 includes a sampling switch device 314 that is connected between the output of the ramp generator and an input of a sync buffer 316. A sample and hold capacitor C_SH is connected between the input of the buffer 316 and electrical ground. The sampling switch device 314 thus is activated in response to the SAMPLE signal (from timing logic 206) to sample the ramp signal and to charge the sample and hold capacitor C_SH. For example, the SAMPLE signal is provided to sample the ramp signal VRAMP at a corresponding peak thereof such that a corresponding voltage peak of the ramp signal is provided at a non-inverting input of the buffer 316. The inverting input of buffer 316 is electrically connected to its output such that an output 318 of the buffer 316 provides a buffered peak ramp signal corresponding to the sync peak output signal SYNC_PK (e.g., as an input voltage, VSYNC_PK) to a phase reference generator circuit 320.

The phase reference generator circuit 320 (e.g., corresponding to phase reference generator 210) is connected between the output 318 of the buffer 316 and electrical ground. The phase reference generator circuit 320 is configured as a voltage divider to provide a phase reference voltage signal VPH_REF at an inverting input of the output comparator 310 based on the input voltage of the sync peak output signal SYNC_PK. The comparator 310 is configured to generate the corresponding phase clock (PHASE_CLK) at 360 based on a difference between the ramp signal VRAMP and the phase reference signal VPH_REF.

In the example of FIG. 3, the phase reference generator circuit 320 is demonstrated as a resistive voltage divider circuit that includes a plurality of resistors R1, R2, R3 through RN connected in series between the output 318 and electrical ground, where N is positive integer denoting the number of resistors. A switch network 322 includes a plurality of switch devices 324, 326 and 328 connected between intermediate nodes of respective resistors R1, R2, R3 to RN (where N is a positive integer greater than one) and the inverting input 319 of the comparator 310. A phase angle selection signal (PHASE_ANGLE_SEL) is provided to select none or a selected one of the respective switch devices in the switch network that is to be activated to tap a corresponding voltage from the divider circuit of the reference generator circuit 320.

In one example, the reference generator circuit 320 is configured for a four phase clock signal (e.g., N=4) and thus includes three switch devices 324, 326 and 328 connected to intermediate nodes between respective adjacent pairs of the resistors. As an example, for generating the clock signal for zero (0°) phase of the PHASE_CLK signal, none of the switches is activated (e.g., switches 324, 326 and 328 remain open) and the CLK_PRE is utilized to generate the initial phase clock. For a second or 90° phase signal, the switch device 324 is activated to electrically connect the input 319 to the intermediate node between resistors R3 and RN (i.e., R4). When the phase angle selection signal selects the next phase corresponding to the 180° phase, the switch device 326 is activated to electrically connect the node between resistors R2 and R3 with the input 319. Similarly, in response to the phase angle selection signal activating switch device 328 for the phase 270 clock signal, the node between resistors R1 and R2 is electrically connected to the input 319 through such switch device. This process will repeat for each cycle according to the number of phases in the clock signal.

Additionally, a corresponding error current signal I_ERROR is provided (by a phase error correction circuit 330 directly) to the phase reference generator circuit 320 to adjust the phase reference signal VPH_REF (e.g., providing an adjusted phase reference signal) to compensate for errors in the PHASE_CLK signal. As disclosed herein, the error signal I_ERROR varies according to which phase clock is being generated. For example, the phase error correction circuit 330 is configured to provide an error current signal I_ERROR based on a CLK_PRE signal, the phase angle selection signal and the PHASE_CLK signal that is fed back from the output at 360. The output 318 of the buffer 316 operates as a virtual ground such that the error current signal I_ERROR provided by the phase error correction circuit 330 flows through the activated switch through one or more resistors to ground as to adjust the corresponding phase reference voltage that is being produced by the divider circuit and applied at the inverting input 319. As disclosed herein, the error signal I_ERROR varies based on the phase clock signal that is fed back as an input as well as based on the phase angle selection signal that is provided to specify which phase clock is being generated. For example, the phase angle selection signal include one or more digital signals to define in which phase the clock should be. The phase angle selection signal may be generated by the on chip memory or decoded from I/O terminals that receive signals generated external to an IC implementing the circuit 300.

As a further example, control logic 304 is configured to control phase error correction circuitry 330. The control logic 304 includes a first AND gate 332 having an input that is coupled to the output 360 to receive the PHASE_CLK signal and another input coupled to a Q output of a DQ flip flop 334. The AND gate 332 thus provides an output signal to an input of an OR gate 336 based on the logical AND operation of its input signals (PHASE_CLK and Q). Another AND gate 338 has an input coupled to an inverted Q output of flip flop 334 and another input coupled to receive a CLK_PRE signal. The AND gate 338 thus logically ANDs the CLK_PRE signal with the inverted Q output signal to provide an output to another input of the OR gate 336. The OR gate is configured to provide an output to a clock input of the flip flop 334 for controlling propagation of signals in the flip flop 334. The D input of flip flop 334 is coupled to the inverted Q output. The Q and inverted Q outputs are also coupled to control respective switch devices 340 and 342, respectively, of the phase error correction circuit 330.

The phase error correction circuit 330 (e.g., corresponding to phase error correction circuit 212) includes a charge current source 344 connected between switch device 340 and a voltage potential, such as VCC of an integrated circuit implementing the circuit 300. A discharge current source 346 is connected between the switch device 342 and electrical ground. A node connected between switches 340 and 342 is electrically connected to an inverting input of a gain amplifier 350. For example, the amplifier 350 is a transconductance amplifier configured to convert the ERROR signal to a corresponding error current signal (I_ERROR) according to a gain thereof (Gme) and based on a reference provided to its non-inverting input. The non-inverting input of amplifier 350 is connected to a DC voltage, such as 1V or another DC voltage. For example, because the negative terminal of the amplifier 350 is set to positive DC voltage (e.g., 1V) the phase error vary by a relatively large amount (e.g., +/−100 mV) during each cycle to make the loop error corrections compared to other approaches such the circuit of FIG. 1. An error capacitor (Ce) is connected between the inverting input of amplifier 350 and electrical ground (e.g., in parallel with switch 342 and current source 346). A voltage across the capacitor Ce provides a corresponding phase error signal to the inverting input of the amplifier 350.

By way of example, the Q and inverted Q outputs of flip flop 334 are utilized to control the switch devices 340 and 342 in a mutually exclusive manner. For example, when the Q output activates switch 340, charge current (Ic) from the current source 344 flows through the switch device and to charge the capacitor Ce and provide the corresponding phase error voltage at the inverting input. During this charging time, the switch device 342 is open allowing the charge to build on the capacitor Ce. When the inverted Q output activates the switch device 342 to an ON condition, the Q output deactivates the switch device 340, such that the charge current is no longer provided to the capacitor Ce and a corresponding discharge current (Id) is provided to discharge the capacitor through the switch 342 and to electrical ground. The amplitude of the charging and discharging currents Ic and Id can vary depending on the number of phases and which phase clock is being generated by the circuit 300.

The following table demonstrates a relative ratio of the charge current and discharge current that is provided in response to the phase angle selection signal for a different number of phases of clock signals that can be generated.

| Phase Number | Phase Angle | Ic:Id |
|---|---|---|
| Two Phases | Phase 1 (0°) | Not needed |
| | Phase 2 (180°) | 1:1 |
| Three Phases | Phase 1 (0°) | Not needed |
| | Phase 2 (120°) | 2:1 |
| | Phase 3 (240°) | 1:2 |
| Four Phases | Phase 1 (0°) | Not needed |
| | Phase 2 (90°) | 3:1 |
| | Phase 3 (180°) | 1:1 |
| | Phase 4 (270°) | 1:3 |

The amplifier 350 thus compares the resulting phase error signal with the one volt (or other DC voltage) to provide a corresponding error current (I_ERROR) that is provided directly to the phase reference generator circuit 320 to adjust the sync reference signal that is being generated for the selected phase.

By way of further example, an effective resistance (Rsnpi) of the phase reference generator circuit 320 (e.g., as seen at node 319 corresponding to VPH_REF) can be expressed as follows:

$$Rsnpi = R0*Npi*(1-Npi/Np)/Np \qquad \text{Eq. 1}$$

where:
R0 is the total resistance of R1 to RN (assuming each of R1 to RN have the same resistance)
Np denotes the number of phases
Npi denotes a selected phase (e.g., specified by PHASE_ANGLE_SEL) e.g., Npi=1, 2, . . . , (Np−1)

Therefore, design parameters of the circuit 300 can be configured to make the phase error loop converge efficiently by setting the loop parameters satisfy the following equation:

$$Gme < 2*Ce*VSYNC\_PK/(Id*(1+Ic/Id)*Rsnpi*T) \qquad \text{Eq. 2}$$

where:
Gme is the gain of amplifier 350
Ce is the capacitance of error capacitor Ce
VSYNC_PK is the peak value of VRAMP, sampled at 318 (provided by sync buffer 316)
Ic is the charge current (provided by current source 344)
Id is the discharge current (provided by current source 346)
T denotes the period of the multi-phase clock signal PHASE_CLK For a nominal design, such as the circuit 300, it can be shown further that by setting the loop parameters to satisfy the following Eq. 3 that many phase errors can be corrected in one cycle over an expected range of frequencies (e.g., 400 KHz to 2.5 MHz) and for any number of two or more phases (e.g., 2 to six phases or more) that may be implemented for the circuit.

$$R0*Gme*Id/Ce*T/VSYNC\_PK*(1-Npi/Np) = 1 \qquad \text{Eq. 3}$$

From Eq. 3, there are two convenient design parameter settings that may be configured to achieve the desired stability and correction characteristics for the correction loop. As one example, parameters associated with the discharging current Id, namely setting Id*T/VSYNC_PK are to be kept at a constant value. Additionally, in this example, the term Gme*(1−Npi/Np) is to be kept constant, such as by setting the GM cell resistor Re proportional to (1−Npi/Np). As another example to achieve the desired stability, the circuit 300 can be configured so that the gain value Gme is kept the constant, but value of Id*T*(1−Npi/Np)/VSYNC_PK is set to a constant value. These design parameters thus may be achieved by designing the circuitry in an IC chip implementing the circuit 300 with values to maintain the relationships described above or otherwise consistent with Eq. 3. In the example implementation of circuit 300, ID*T/VSYNC_PK=ID*C_RAMP/IRAMP. Therefore, if C_RAMP is fixed for all frequencies and phases, then to keep ID*T/SYNC_PK at a constant value also means to set ID proportional to IRAMP.

Figure 4:
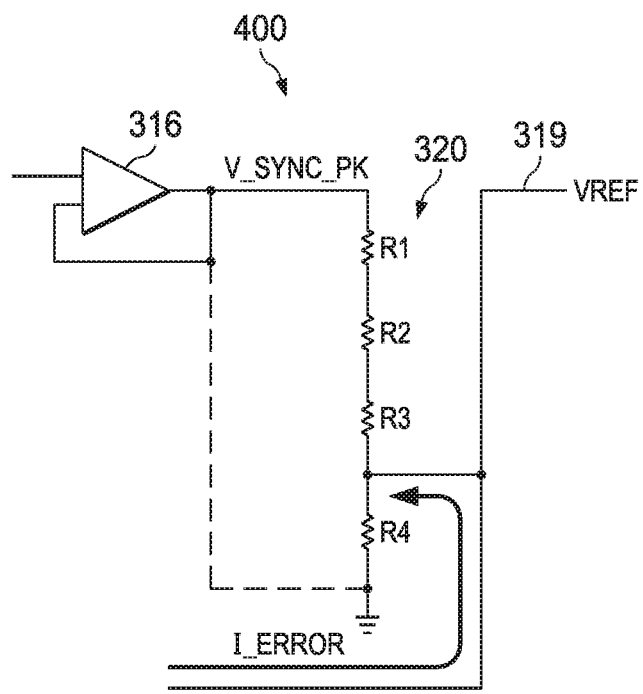
FIG. 4 is an example of part of the circuit of FIG. 3 demonstrating operation for a first phase angle selection.
Figure 5:
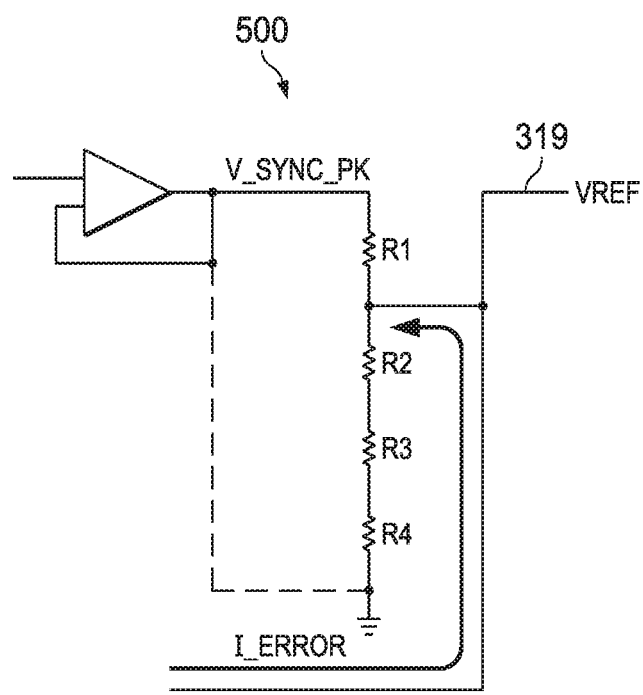
FIG. 5 is an example of part of the circuit of FIG. 3 demonstrating operation for a second phase angle selection.

As a further example, FIGS. 4 and 5 demonstrate operation for part of the circuit 300 of FIG. 3 that includes the phase error correction loop and phase reference generator circuit for an example where the circuit is configured for four phases (Np=4) and the number of resistors is also N=4. FIG. 4 illustrates a circuit 400 for an example when the phase corresponding to ninety degrees is selected by the phase angle selection signal. In this example, the output of the phase reference generator is connected through a corresponding switch device (e.g., switch device 324 in FIG. 3)

between resistors R3 and R4. Because the output 318 of the buffer 316 operates as a virtual ground, the resistance of the reference generator circuit 320 corresponds to R1+R2+R3 in parallel with R4. Assuming that each of the resistors has a common resistance (e.g., a unit resistance, Runit), the total resistance is set equal to ¾Runit. Thus, the voltage VPH_REF is equal to ¼*VSYNC_PK+ ¾ *Runit*I_ERROR.

FIG. 5 illustrates a circuit 500 for an example when the fourth phase, corresponding to 270, degrees is selected by the phase angle selection signal. In this example, the node 319 is electrically connected between resistors R1 and R2. The error correction current thus is provided (e.g., through closed switch 328 for phase 270) to the node between R1 and R2 to result in a corresponding reference voltage VPH_REF being provided to the ramp comparator, as disclosed herein. In this example, the total resistance is set equal to ¾*Runit. Thus, the voltage VPH_REF is equal to ¾*VSYNC_PK+¾ *Runit*I_ERROR. The voltage VPH_REF may be determined in a similar manner for different selected ones of the four phases in this example, as well as for other examples having different numbers of phases.

Figure 6:
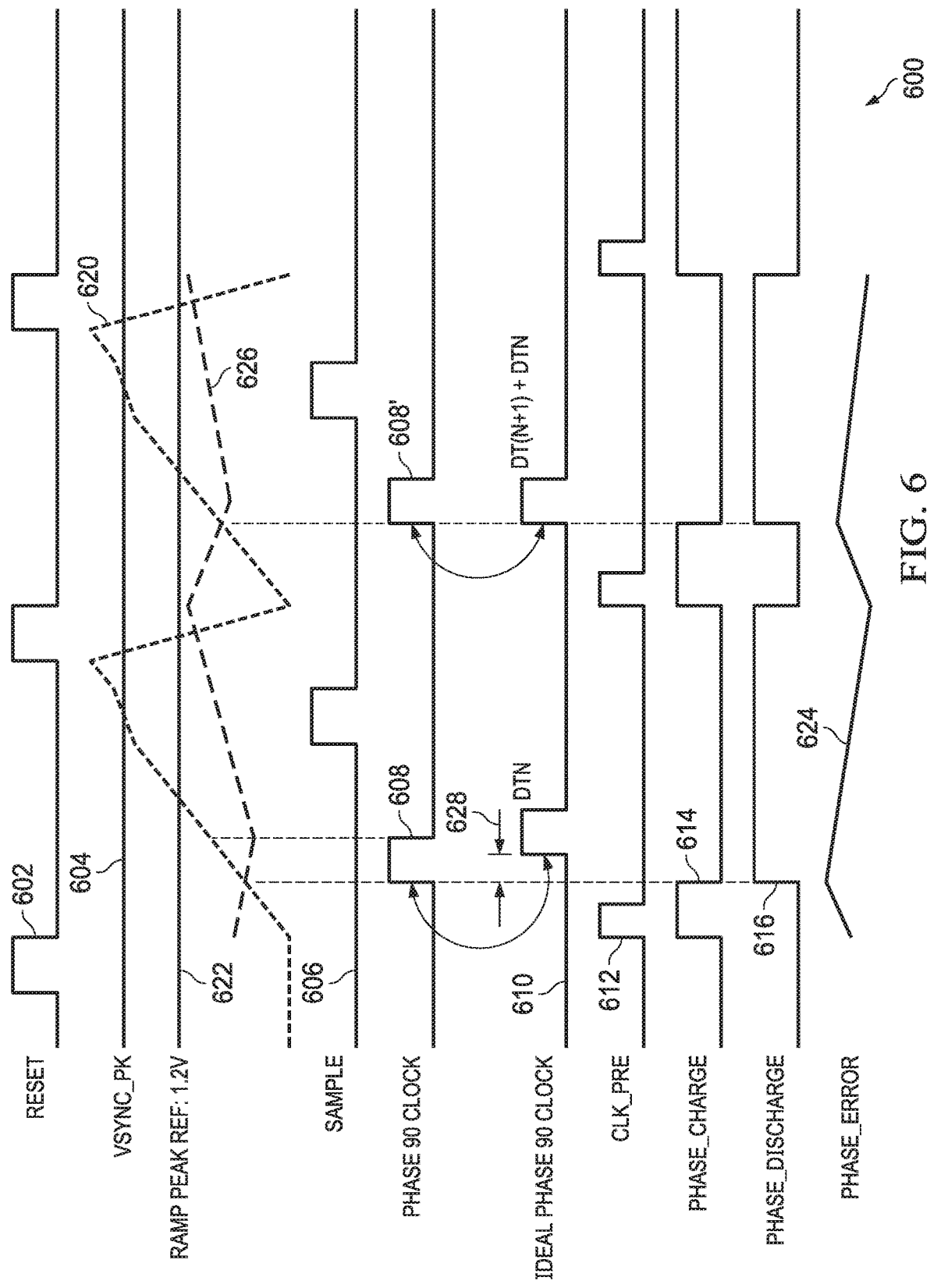
FIG. 6 is a timing diagram illustrating an example of various signals in the circuit of FIG. 3.

FIG. 6 depicts an example of a timing diagram 600 demonstrating various signals in the circuit 300 of FIG. 3. In this example, the signals demonstrated include a reset signal 602 (e.g., RESET signal provided to switch device 308), a sync_peak signal 604 (e.g., the signal at the output of buffer 316), a SAMPLE signal 606 (e.g., SAMPLE signal provided to switch device 314), a phase 90 clock signal 608 (e.g., PHASE_CLK at output 360 for a 90° phase), an example of an ideal phase 90 clock signal 610 (assuming no errors) and a CLK_PRE signal 612. The timing diagram 600 also includes a CLK_PRE signal 612 as well as a phase charge signal 614 (e.g., used to activate switch 340 to charge capacitor Ce) and phase discharge signal 616 (e.g., used to activate switch 342 to discharge capacitor Ce). Also shown VRAMP signal 620 (e.g., corresponding to the ramp signal VRAMP). In this example, a ramp peak reference 622 is generated at 1.2 volts.

As demonstrated in FIG. 6, a phase error signal 624 (e.g., PHASE_ERROR applied to amplifier 350) increases and decreases based on the phase charge and phase discharge signals 614 and 616 that are generated accordingly. The phase error signal 624 is utilized to compensate for errors in the phase 90 clock. The first phase 90 clock pulse 608 thus has an error 628 with respect to the ideal phase clock 610. This error 628 is corrected by the next phase clock at 608', which demonstrates that the phase error between the rising edges of the phase clock are corrected in a single period of the clock signal.

As shown in FIG. 6, the rising edge of the CLK_PRE signal 612 begins the phase charge cycle such that the phase error rises linearly. As one example, the CLK_PRE is generated based on the RAMP signal 620 (e.g., provided by ramp generator 204 within an IC chip implementing the clock generator 200). For example, when the RAMP signal 620 reaches the ramp peak reference voltage (e.g., 1.2V) 622, will generate the SAMPLE signal (e.g., a 10 ns wide pulse) will be generated (e.g., by timing logic 206) to sample the RAMP voltage for providing the VSYNC_PK signal. At the end of SAMPLE signal, a short RESET signal will be generated (e.g., by timing logic 206) and provided to the ramp generator 204 to discharge the RAMP signal to 0. At the end of the RESET signal, a next short CLK_PRE signal will be generated. In another example, the CLK_PRE signal is generated based on a synchronization signal that is generated external to the IC implementing the clock generator 200. In this example, when the external synchronization signal rises or falls, it will generate the SAMPLE signal (e.g., 10 ns wide pulse) to trigger the peak detector to sample the RAMP voltage for providing the VSYNC_PK. At the end of SAMPLE signal, another short RESET signal (e.g., 10 ns wide pulse) will be generated to discharge the RAMP signal 620 to 0 V. At the end of the RESET signal, another short CLK_PRE signal will be generated.

The error corrected synchronization voltage phase reference signal (e.g., VPH_REF) is demonstrated at 626. The sample peak of the VRAMP signal is compensated such that the phase clock signal is generated corresponded to the corrected phase 90 clock demonstrated at 608'. The rising edge of the phase 90 clock signal 608, 608' triggers the phase discharge signal 616 such that the phase error signal decreases linearly in response to the phase discharge signal being activated. At the beginning of the cycle the phase error for the 90 phase clock signal is demonstrated at 628 (e.g., Dtn). At the end of the cycle corresponding to clock pulse 608', the phase clock signal is corrected corresponding to the error compensation (e.g., the phase error is Dtn(n+1)+Dtn).

Figure 7:
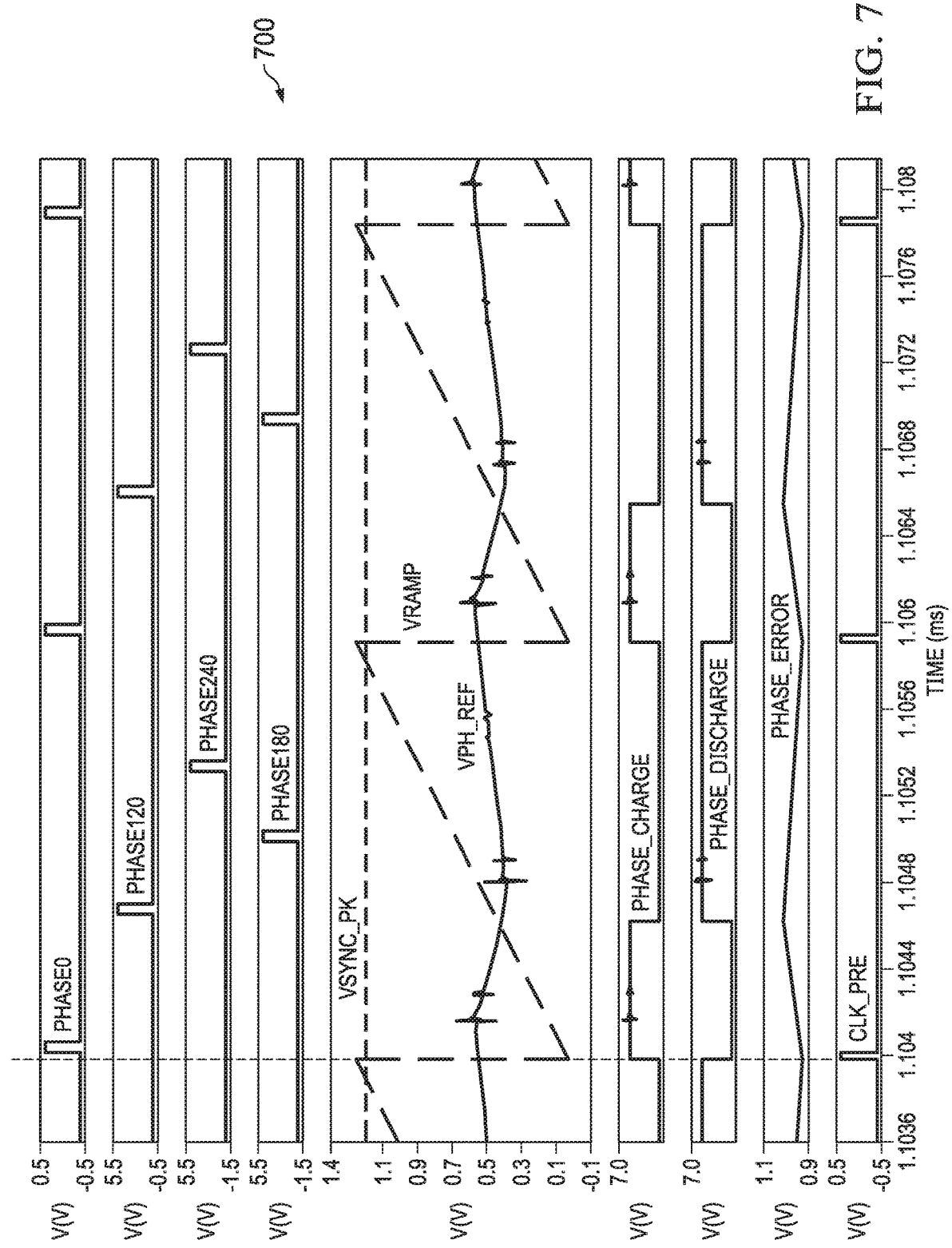
FIG. 7 illustrates simulation results for a set of signals in an example clock synchronization circuit.
Figure 8:
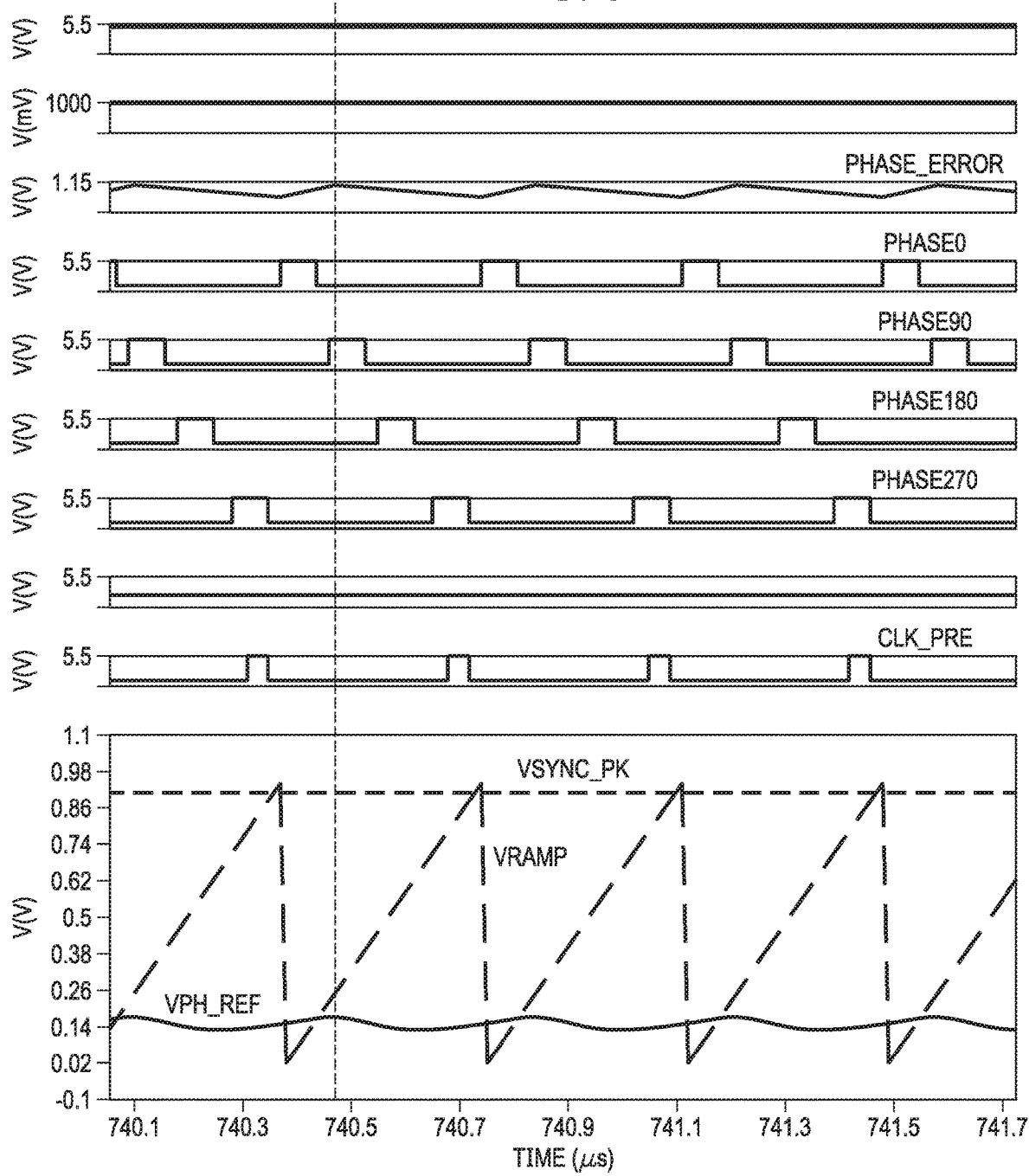
FIG. 8 illustrates simulation results for another set of signals in an example clock synchronization circuit.

FIGS. 7 and 8 are simulation results demonstrating sets of waveforms 700 and 800 in an example multi-phase clock generation circuit (e.g., clock generator circuit 200, 300) configured with different numbers of phases. In each of FIGS. 7 and 8 the same nomenclature is used to refer to the various signals described herein with respect to FIG. 3.

In the example of FIG. 7, the waveforms 700 include a three-phase clock signal PHASE_0, PHASE_120, and PHASE_240 (e.g., PHASE_CLK generated by circuit 200, 300) and having a period of about 1.9 µs. Also demonstrated in FIG. 7 are a VSYNC_PK signal, a Vramp signal (e.g., corresponding to the ramp signal VRAMP), and a corrected synchronization reference signal VPH_REF for phase 120. By way of further context FIG. 7 also shows a phase charge signal (PHASE_CHARGE) and phase discharge signal (PHASE_DISCHARGE), and a resulting phase error signal PHASE_ERROR as well as the clock preset signal CLK_PRE, as disclosed herein.

FIG. 8 demonstrates a similar set of waveforms but for the multi-phase clock generator circuit (e.g., circuit 200, 300) configured to generate a four-phase clock signal that includes the waveforms 700 include a three-phase clock signal PHASE_0, PHASE_90, PHASE_180 and PHASE_270 and having a period of about 370 ns (a frequency of about 2.7 MHz). The example of FIG. 8 thus demonstrates a VSYNC_PK signal, a Vramp signal (e.g., corresponding to the ramp signal VRAMP), and a corrected synchronization reference signal VPH_REF for phase 90. By way of further context FIG. 8 also shows a resulting phase error signal PHASE_ERROR as well as the clock preset signal CLK_PRE, as disclosed herein.

In view of the foregoing, a clock generator circuit (e.g., 200, 300) includes a phase error correction loop having circuitry (e.g., 212, 330) that may be configured to have a constant loop gain for all frequencies and phases. For example, by configuring the phase correction loop to feed the error current from the transconductance amplifier directly to the node 319 generating the reference, the loop gain may remain fixed for each of the phases of the multi-phase clock generator 300, and for a very wide range of clock frequencies. In an example, the fixed loop gain is enabled by setting one or more component parameters to satisfy Eq. 3. Moreover, in contrast to the approach in FIG. 1, because the error current is fed to the node 319 instead of being fed to the sync buffer 316, the buffer 316 can be implemented with less expensive components (e.g., lower bandwidth and burn smaller power) that can function under smaller supply voltages.

Moreover, the approach disclosed herein enables variations of adjustable phase ranges among all phases to be decreased, thereby increasing the adjustable range of the total phase error correction loop. For example, the approach in FIG. 1 uses a simple resistor divider, such that whatever the error correction voltage is provided, phase 90 receives only about ¼ of the total range, phase 270 receives ¾ of the total range, which is 3 times of the range of phase 90. In contrast, in the approach disclosed with respect to FIGS. 2-8, buffer output VSYNC_PK at 318 is essentially virtual ground, such that the highest correction range is for a mid-node phase (e.g., at) 180°, which has effective resistance of 1 unit R, phase 90 and phase 270 have effective resistance of ¾ unit R, such that the highest range/lowest range is only about 1.33, compared to about 3 for the approach in FIG. 1.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A multi-phase clock generator circuit comprising:
    a phase reference generator circuit configured to generate a phase reference signal in response to a phase selection signal and a peak ramp signal;
    a phase error correction circuit configured to provide an error signal based on a synchronization clock signal and a multi-phase clock signal, the error signal being applied to the phase reference signal to correct for phase errors in the multi-phase clock signal and produce a corrected phase reference signal; and
    a comparator configured to compare a ramp signal and the corrected phase reference signal to produce the multi-phase clock signal.

2. The multi-phase clock generator circuit of claim 1, further comprising a synchronization ramp generator circuit arranged to generate the ramp signal in synchronization with the synchronization clock signal.

3. The multi-phase clock generator circuit of claim 2, further comprising:
    a sample and hold circuit configured to sample the ramp signal in response to a sample signal and to provide the peak ramp signal; and
    a buffer circuit coupled to receive the sampled peak ramp signal, the buffer circuit having an output terminal coupled to provide a buffered peak ramp signal to the phase error correction circuit.

4. The multi-phase clock generator circuit of claim 3, wherein the phase reference generator circuit comprises:
    a resistor network coupled between the output terminal of the buffer circuit and electrical ground; and
    a switch tap network configured to tap a respective intermediate node of the resistor network based on the phase selection signal.

5. The multi-phase clock generator circuit of claim 4, wherein the switch tap network comprises switch devices coupled between respective intermediate nodes of the resistor network and an output of the phase reference generator circuit, one of the switch devices being activated to tap a respective intermediate node in response to the phase selection signal.

6. The multi-phase clock generator circuit of claim 4, wherein the resistor network comprises a set of resistors connected in series between the output terminal of the buffer circuit and electrical ground.

7. The multi-phase clock generator circuit of claim 1, wherein the phase error correction circuit further comprises a transconductance amplifier configured to generate the error signal as an error current signal having an amplitude based on a phase error signal and a reference voltage, wherein the phase error signal is representative of an error between the multi-phase clock signal and the synchronization clock signal.

8. The multi-phase clock generator circuit of claim 7, wherein the phase reference generator circuit comprises:
    a buffer circuit configured to receive the peak ramp signal and to provide a buffered peak ramp signal;
    a resistor network coupled between an output terminal of the buffer circuit and electrical ground; and
    a switch tap network configured to tap a respective intermediate node of the resistor network based on the phase selection signal and provide a corresponding tapped resistance at a node corresponding to an input of the comparator receiving the phase reference signal, wherein the phase error correction circuit is further configured to provide the error current signal directly to the node such that the phase reference signal is compensated to provide the corrected phase reference signal.

9. The multi-phase clock generator circuit of claim 8, wherein the phase error correction circuit further comprises:
    an error capacitor coupled to an input of the amplifier receiving the phase error signal;
    a charge current source configured to provide a charging current to charge the error capacitor during a charge period of each clock cycle;
    a discharge current source configured to provide a discharging current to discharge the error capacitor during a discharge period of each clock cycle;
    wherein the phase error signal is supplied to the amplifier based on the charging and discharging of the error capacitor.

10. The multi-phase clock generator circuit of claim 9, wherein each of the charge current source and the discharge current source is configured to set a respective current magnitude based on the phase selection signal.

11. The multi-phase clock generator circuit of claim 9, wherein the transconductance amplifier is configured to have a gain that is constant over frequency and the discharge current source is configured such that the discharging current is set proportional to frequency of the multi-phase clock signal.

12. The multi-phase clock generator circuit of claim 9, wherein the transconductance amplifier is configured to have a gain that is fixed and the transconductance amplifier is configured such that $Id*T*(1-Npi/Np)/Vsync\_pk$ is set to a constant value, where
    Id is the discharging current,
    T is the period of the multi-phase clock signal,
    Vsync_pk is the buffered peak ramp signal, Npi is a selected phase of the multi-phase clock signal, and Np is a number of phases.

13. The multi-phase clock generator circuit of claim 9, wherein the transconductance amplifier is configured such that Gme*(1−Npi/Np) is set to a first constant value, and Id*T/Vsync_pk is set to a second constant value, where Gme is the transconductance of the transconductance amplifier, Id is the discharging current, T is the period of the multi-phase clock signal, Vsync_pk is the buffered peak ramp signal, Npi is a selected phase of the multi-phase clock signal, and Np is a number of phases.

14. The multi-phase clock generator circuit of claim 9, wherein the multi-phase clock generator circuit is configured to satisfy the following equation:

$$R0*Gme*Id/Ce*T/Vsync\_pk*(1-Npi/Np) \approx 1$$

where:

R0 is a total resistance of resistors in the resistor network,

Gme is a gain of the transconductance amplifier,

Id is the discharging current,

Ce is the capacitance of the error capacitor,

T is the period of the multi-phase clock signal,

Vsync_pk is a voltage of the buffered peak ramp signal,

Npi is a selected phase of the multi-phase clock signal, and

Np is a number of phases.

15. The multi-phase clock generator circuit of claim 1, further comprising synchronization timing logic configured to control timing of the ramp signal based on the synchronization clock signal.

16. The multi-phase clock generator circuit of claim 1, further comprising a synchronization clock generator that is configured to generate the synchronization clock signal internally within the multi-phase clock generator circuit or externally from the multi-phase clock generator circuit.

17. A multi-phase clock generator circuit comprising:

a ramp generator that includes an output;

a comparator having first and second inputs and a clock output, the first input being coupled to the output of the ramp generator;

a peak detector circuit having an input coupled to the output of the ramp generator;

a buffer having an input coupled to an output of the peak detector circuit;

a phase reference generator circuit having an input coupled to an output of the buffer and having an output coupled to the second input of the comparator; and a phase error correction circuit having an input coupled to the clock output and having an output coupled to the second input of the comparator.

18. The circuit of claim 17, wherein the peak detector circuit is configured to provide a peak ramp signal at the output of the peak detector circuit based on a ramp signal provided at the output of the ramp generator, the phase reference generator circuit is configured to generate a phase reference signal in response to a phase selection signal and the peak ramp signal, the phase error correction circuit is configured to apply an error signal to the phase reference signal at the second input of the comparator to correct for phase errors in a multi-phase clock signal that is provided by the comparator at the clock output based on a comparison of the ramp signal and the phase reference signal.

19. The circuit of claim 18, further comprising:

timing logic configured to provide a sample signal based on a synchronization signal; and the peak detector circuit comprising a sample and hold circuit configured to sample the ramp signal in response to the sample signal and to provide the peak ramp signal to the input of the buffer.

20. The circuit of claim 18, wherein the phase reference generator circuit comprises:

a voltage divider circuit coupled between the output of the buffer and electrical ground; and a switch tap network configured to tap a respective node of a plurality of intermediate nodes of the voltage divider circuit based on the phase selection signal to provide the phase reference signal to the second input of the comparator.

21. The circuit of claim 17, wherein the phase error correction circuit further comprises a transconductance amplifier having a first input to receive a phase error voltage signal and a second input to receive a reference voltage, the transconductance amplifier configured to generate the error signal as a current error signal having an amplitude based on the phase error voltage signal and the reference voltage, wherein the phase error voltage signal is representative of an error between a multi-phase clock signal and a synchronization clock signal.

22. The circuit of claim 21, wherein the phase error correction circuit further comprises:

an error capacitor coupled to the first input of the transconductance amplifier for receiving the phase error voltage signal;

a charge current source configured to provide a charging current to charge the error capacitor during a charge period of each clock cycle; and a discharge current source configured to provide a discharging current to discharge the error capacitor during a discharge period of each clock cycle that is different from the charge period, wherein the phase error voltage signal, which is supplied to the first input of the transconductance amplifier, varies based on the charging and discharging of the error capacitor.

23. A system comprising:

a ramp generator configured to provide ramp signal based on a synchronization clock signal;

a peak detector configured to detect a peak in the ramp signal during each period of a multi-phase clock signal and provide a peak ramp signal;

a phase reference generator configured to generate a phase reference signal based on the peak ramp signal and a phase angle selection signal;

a phase error correction circuit configured to provide an error current signal based on the synchronization clock signal and the multi-phase clock signal, the error current signal being applied to the phase reference generator to correct the phase reference signal and provide a corrected phase reference signal;

a comparator configured to provide the multi-phase clock signal based on the ramp signal and the corrected phase reference signal; and a power supply configured to supply power at an output thereof based on the multi-phase clock signal.

24. The system of claim 23, wherein the phase error correction circuit further comprises:

a transconductance amplifier configured to generate the error current signal having an amplitude based on a phase error voltage signal and a reference voltage, wherein the phase error voltage signal is representative of an error between the multi-phase clock signal and a synchronization clock signal;

an error capacitor coupled to a first input of the transconductance amplifier for receiving the phase error voltage signal;

a charge current source configured to provide a charging current to charge the error capacitor during a charge period of each clock cycle; and a discharge current source configured to provide a discharging current to discharge the error capacitor during a discharge period of each clock cycle that is different from the charge period, wherein the phase error voltage signal varies based on the charging and discharging of the error capacitor.

* * * * *